United States Patent
Cheesman

(10) Patent No.: US 9,755,531 B2
(45) Date of Patent: Sep. 5, 2017

(54) POWER SUPPLIES HAVING MULTI-TAP VOLTAGE ATTENUATORS AND METHODS OF POWER SUPPLY ASSEMBLY

(71) Applicant: SIEMENS AKTIENGESELLSCHAFT, München (DE)

(72) Inventor: Edward Alan Cheesman, Chicora, PA (US)

(73) Assignee: SIEMENS AKTIENGESELLSCHAFT, München (DE)

(*) Notice: Subject to any disclaimer, the term of this patent is extended or adjusted under 35 U.S.C. 154(b) by 182 days.

(21) Appl. No.: 14/767,112

(22) PCT Filed: Feb. 21, 2014

(86) PCT No.: PCT/US2014/017332
§ 371 (c)(1),
(2) Date: Aug. 11, 2015

(87) PCT Pub. No.: WO2014/130637
PCT Pub. Date: Aug. 28, 2014

(65) Prior Publication Data
US 2015/0381066 A1     Dec. 31, 2015

Related U.S. Application Data

(60) Provisional application No. 61/767,308, filed on Feb. 21, 2013.

(51) Int. Cl.
*H02M 1/08*     (2006.01)
*H02M 3/335*   (2006.01)
(Continued)

(52) U.S. Cl.
CPC ......... *H02M 3/33561* (2013.01); *H02M 1/08* (2013.01); *H03H 7/24* (2013.01); *H05K 3/36* (2013.01); *H02M 2001/0003* (2013.01)

(58) Field of Classification Search
CPC ... H02M 1/08; H02M 2001/0003; H05K 3/38
(Continued)

(56) References Cited

U.S. PATENT DOCUMENTS 4,636,927 A     1/1987 Rhyne et al.
5,260,996 A     11/1993 Dillon et al.
(Continued)

FOREIGN PATENT DOCUMENTS

CN     1055451 A     10/1991

OTHER PUBLICATIONS

PCT International Search Report mailed Feb. 13, 2015 corresponding to PCT International Application No. PCT/US2014/017332 dated Feb. 20, 2014 (11 pages).

*Primary Examiner* — Robert Deberadinis

(57) ABSTRACT

A printed circuit board of a power supply has a multi-tap voltage attenuator mounted thereon that may provide a selectable plurality of attenuated voltages based on a received voltage. A power supply may include two or more of the same printed circuit boards to attenuate different input and output power supply voltages to one or more desired lower voltages. The attenuated voltages may be input to, e.g., a controller of the power supply to monitor and, when necessary, adjust one or more parameters of the output power supply voltage. The selectable plurality of attenuated voltages allows substantially identical printed circuit boards to be used in the same and/or different power supplies for attenuating different voltages. Methods of assembling power supplies are also provided, as are other aspects.

17 Claims, 7 Drawing Sheets

(51) Int. Cl.
    *H03H 7/24*     (2006.01)
    *H05K 3/36*     (2006.01)
    *H02M 1/00*     (2006.01)

(58) Field of Classification Search
    USPC .......................................................... 307/42
    See application file for complete search history.

(56) References Cited

U.S. PATENT DOCUMENTS

| | | |
|---|---|---|
| 6,489,755 B1 | 12/2002 | Boudreaux, Jr. et al. |
| 2005/0093606 A1 | 5/2005 | Kaiser, Jr. |
| 2006/0269186 A1 | 11/2006 | Frame et al. |
| 2011/0084784 A1 | 4/2011 | Das et al. | ular input or output voltage may not be suitable for a different input and/or output voltage. Thus, a large number of voltage attenuators may need to be designed and stocked when assembling power supplies having different input and output voltages. Accordingly, more adaptable voltage attenuators are desired.

POWER SUPPLIES HAVING MULTI-TAP VOLTAGE ATTENUATORS AND METHODS OF POWER SUPPLY ASSEMBLY

CROSS REFERENCE TO RELATED APPLICATION

This Application is the U.S. National Stage of International Application No. PCT/US2014/017332 filed Feb. 20, 2014, and claims benefit thereof, the entire content of which is hereby incorporated herein by reference for all purposes. The International Application claims priority to U.S. Provisional Patent Application No. 61/767,308, filed Feb. 21, 2013, which is hereby incorporated herein by reference in its entirety for all purposes.

FIELD

The invention relates generally to power supplies, and more particularly to power supplies having voltage attenuators.

BACKGROUND

Power supplies may have two or more voltage attenuators that are typically used to attenuate (i.e., reduce) input and output voltages of the power supply. The input and output voltages may be attenuated to, e.g., a same lower voltage. The attenuated input and output voltages may be fed to a controller in the power supply to monitor and adjust, when necessary, one or more parameters related to the output voltage of the power supply. For example, if an attenuated output voltage does not correspond as expected to an attenuated input voltage, the controller may cause a power circuit of the power supply to adjust, e.g., a voltage, a current, a waveform, or a phase angle related to the power supply's output voltage. Each voltage attenuator may be designed to attenuate an input and/or output voltage of the power supply to a specified lower voltage. Because the input and output voltages of a power supply may be different, each voltage attenuator used in the power supply may also be different. Further, other power supplies having other input and/or output voltages may require still other voltage attenuators designed to accommodate those other input and/or output voltages. That is, a voltage attenuator designed for a particular input or output voltage may not be suitable for a different input and/or output voltage. Thus, a large number of voltage attenuators may need to be designed and stocked when assembling power supplies having different input and output voltages. Accordingly, more adaptable voltage attenuators are desired.

SUMMARY

According to one aspect, a power supply is provided that includes first and second printed circuit boards. The first printed circuit board has a first voltage attenuator mounted thereon. The first voltage attenuator has a first input attenuator terminal and a plurality of first output attenuator terminals. Each of the first output attenuator terminals is configured to provide a different attenuated voltage based on a first attenuator input voltage received at the first input attenuator terminal. The second printed circuit board has a second voltage attenuator mounted thereon. The second voltage attenuator has a second input attenuator terminal and a plurality of second output attenuator terminals. Each of the second output attenuator terminals is configured to provide a different attenuated voltage based on a second attenuator input voltage received at the second output attenuator terminal. The first voltage attenuator may be substantially identical to the second voltage attenuator.

According to another aspect, a method of assembling a power supply is provided. The method includes: providing a first printed circuit board having a first voltage attenuator thereon, the first voltage attenuator having an input attenuator terminal and a plurality of output attenuator terminals, wherein each of the plurality of output attenuator terminals is operative to output a different attenuated voltage; coupling the input attenuator terminal or one of the plurality of output attenuator terminals serving as an input attenuator terminal of the first voltage attenuator to an input terminal of the power supply; selecting one of the plurality of output attenuator terminals of the first voltage attenuator based on an expected voltage at the input terminal of the power supply; coupling the selected one of the plurality of output attenuator terminals of the first voltage attenuator to a controller or other circuit device of the power supply; providing a second printed circuit board having a second voltage attenuator thereon, the second voltage attenuator having an input attenuator terminal and a plurality of output attenuator terminals, wherein each of the plurality of output attenuator terminals is operative to output a different attenuated voltage; coupling the input attenuator terminal or one of the plurality of output attenuator terminals serving as an input attenuator terminal of the second voltage attenuator to an output terminal of the power supply; selecting one of the plurality of output attenuator terminals of the second voltage attenuator based on an expected voltage at the output terminal of the power supply; and coupling the selected one of the plurality of output attenuator terminals of the second voltage attenuator to the controller or other circuit device of the power supply; wherein the first voltage attenuator is substantially identical to the second voltage attenuator.

According to a further aspect, a second method of assembling a power supply is provided. The method includes: providing a first printed circuit board having a first voltage attenuator thereon, the first voltage attenuator having an input attenuator terminal and a plurality of output attenuator terminals, wherein each of the plurality of output attenuator terminals is operative to output a different attenuated voltage; receiving at a hardware processor: attenuator data related to an amount of voltage attenuation provided at each of the plurality of output attenuator terminals, an expected voltage value of a voltage to be received at the input attenuator terminal or one of the plurality of output attenuator terminals serving as an input attenuator terminal, and one or more attenuated voltage values acceptable for input to a controller or other circuit device of the power supply; determining, by the hardware processor, which one of the plurality of output attenuator terminals provides the one or more attenuated voltage values based on the received attenuator data, the received expected voltage value, and the received one or more attenuated voltage values; and coupling to a first input of the controller or other circuit device one of the plurality of output attenuator terminals of the first voltage attenuator determined to provide the one or more attenuated voltage values.

Still other aspects, features, and advantages of the invention may be readily apparent from the following detailed description wherein a number of exemplary embodiments and implementations are described and illustrated, including the best mode contemplated for carrying out the invention. The invention may also be capable of other and different embodiments, and its several details may be modified in various respects, all without departing from the scope of the invention. Accordingly, the drawings and descriptions are to be regarded as illustrative in nature, and not as restrictive. The drawings are not necessarily drawn to scale. The invention covers all modifications, equivalents, and alternatives falling within the scope of the invention.

DETAILED DESCRIPTION

Reference will now be made in detail to the example embodiments of this disclosure, which are illustrated in the accompanying drawings. Wherever possible, the same reference numbers will be used throughout the drawings to refer to the same or like parts.

The aforementioned problem of designing and stocking a large number of voltage attenuators when assembling power supplies having different voltages requiring attenuation may be overcome by one or more embodiments of the invention. In one aspect, a printed circuit board may have mounted thereon a multi-tap voltage attenuator having a selectable plurality of attenuated output voltages. Based on, e.g., a power supply's input or output voltage, an appropriate attenuated output voltage may be provided by the multi-tap voltage attenuator that may be coupled to a controller or other circuit device of the power supply. An attenuated voltage may be used, e.g., by the controller for monitoring and adjustment, when necessary, of one or more parameters related to the power supply's output voltage. The printed circuit board having a multi-tap voltage attenuator mounted thereon that provides a selectable plurality of attenuated output voltages allows substantially identical printed circuit board attenuators to be used in the same and/or other power supplies having different input and/or output voltages. In other aspects, methods of assembling a power supply are provided, as will be explained in greater detail below in connection with FIGS. 1-7.

Figure 1:
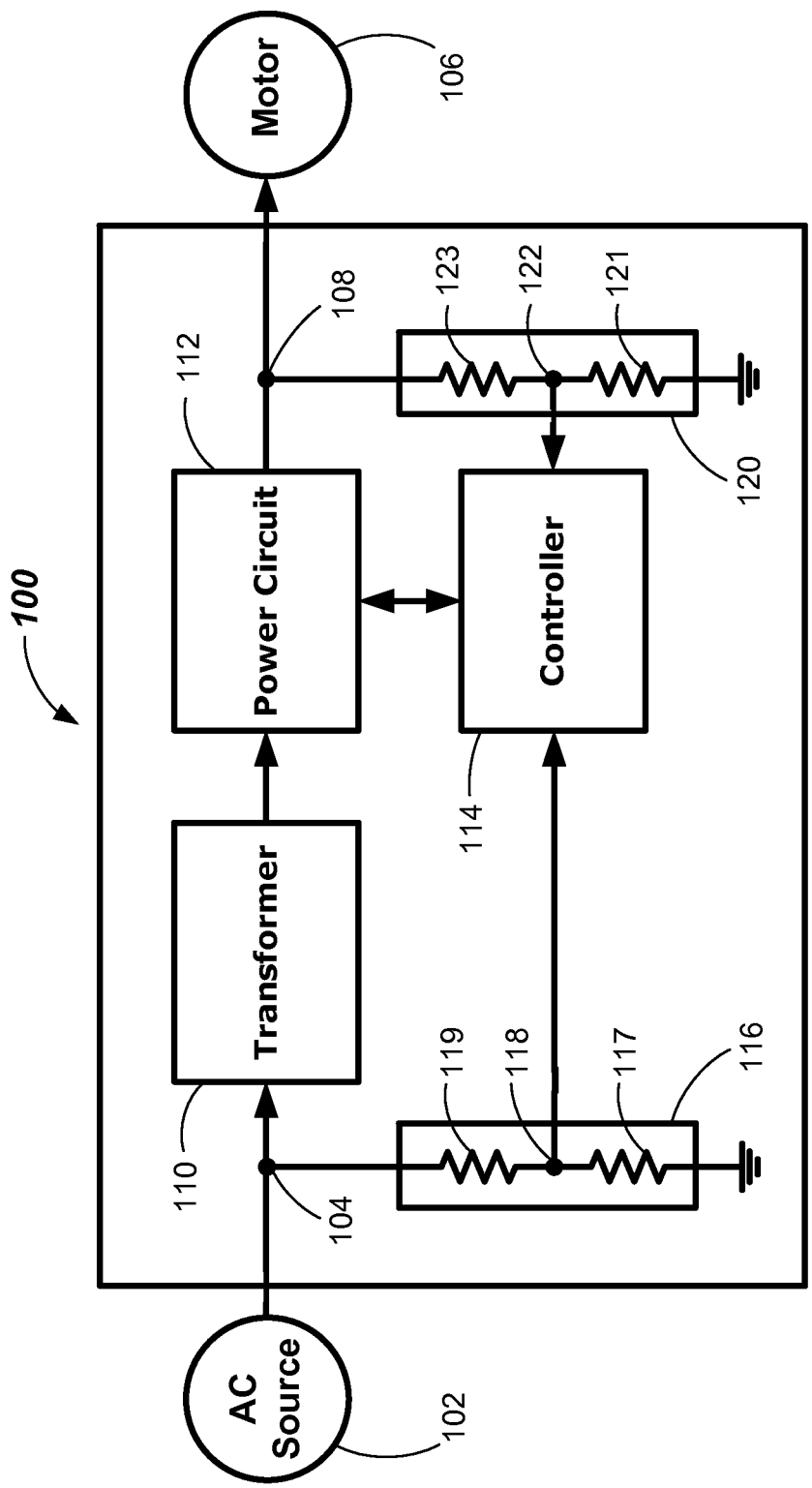
FIG. 1 illustrates a schematic diagram of a power supply according to the prior art.

FIG. 1 illustrates an example of a known power supply 100. A three-phase AC input power source 102 may be coupled to power supply 100 at input terminal 104. In some embodiments, power supply 100 may be a medium-voltage power supply wherein input power source 102 may provide, e.g., from about 277 volts AC to about 8,000 volts AC. Power supply 100 may be coupled to a three-phase AC motor 106 at output terminal 108. Alternatively, power supply 100 may be a different type of power supply and/or may be coupled to other suitable sources of input power at input terminal 104 and/or to other suitable loads at output terminal 108.

Power supply 100 may include a transformer 110, a power circuit 112, and a controller 114. An input of transformer 110 may be electrically coupled to input terminal 104. Transformer 110 may step down an input voltage received at input terminal 104 and may include a primary winding circuit and one or more secondary winding circuits. The primary winding circuit may be, e.g., a star or mesh configured circuit. The secondary winding circuits may, in some embodiments, be star configured, which may include some WYE configured secondary winding circuits and/or some zigzag configured secondary winding circuits. In other embodiments, the secondary winding circuits may be mesh configured, which may include some delta configured secondary winding circuits and/or some extended delta configured secondary winding circuits. The secondary winding circuits may provide three-phase power or single phase power to power circuit 112. Power supply 100 may alternatively have other suitably-configured transformers.

Power circuit 112 may have an input electrically coupled to an output of transformer 110 and may receive power from one of the secondary winding circuits of transformer 110. In some embodiments, power circuit 112 may be a variable frequency drive, which may employ pulse width modulation (PWM). In some embodiments, power circuit 112 may include an input DC-to-AC rectifier, a smoothing filter, and an output DC-to-AC converter. Power circuit 112 may include a plurality of power cells configured in three groups of serially-coupled cells, each group providing one phase of power to a load. For example, in some embodiments, power circuit 112 may include nine power cells configured in three groups of three serially-coupled power cells. In other embodiments, power circuit 112 may include, e.g., 24 power cells configured in three groups of eight serially-coupled power cells. Power circuit 112 may have other suitable numbers of power cells which, for multi-phase power received at input terminal 104, may be in multiples of three. The output voltage provided by each power cell in a serially-coupled group may be added to the output voltage of the other power cells of that group to provide an output voltage at output terminal 108 that may be higher than a voltage received by power circuit 112. In some embodiments, power circuit 112 may provide at output terminal 108 voltages from about 2,300 volts AC to about 14,000 volts AC. Power circuit 112 may alternatively have other suitable circuit configurations and may provide other suitable output voltages and/or ranges of output voltages.

Controller 114 is electrically coupled to power circuit 112 and may provide and receive control signals to and from power circuit 112. Controller 114 may be, e.g., a modulation controller that controls various semiconductor switches (e.g., power transistors) of power circuit 112. Controller 114 may receive one or more low voltage inputs of, e.g., no more than 5 volts, that may represent an input voltage at input terminal 104 and an output voltage at output terminal 108. Controller 114 may monitor and/or compare characteristics of the received inputs and parameters related thereto (such as, e.g., voltages, currents, waveforms, phase angles, etc.) in accordance with, e.g., predetermined voltages, currents, polarities, pulse durations, etc. When necessary, controller 114 may transmit appropriate control signals to power circuit 112 to affect one or more characteristics and/or parameters related to the output voltage at output terminal 108. Other suitable controllers requiring attenuated input voltage signals may alternatively or additionally be used in power supply 100.

Power supply 100 may also include a first voltage attenuator 116 and a second voltage attenuator 120. First voltage attenuator 116 may include resistors 117 and 119 and an output terminal 118 that may be coupled to an input of controller 114. First voltage attenuator 116 may also have an input terminal that may be coupled to input terminal 104 of power supply 100. First voltage attenuator 116 may attenuate (i.e., reduce) a voltage received at input terminal 104 to a desired lower voltage at output terminal 118 that may be suitable for input to controller 114. To provide a desired attenuated voltage at output terminal 118 based on an expected voltage received at input terminal 104, the resistance values of resistors 117 and 119 may be determined in accordance with the following equation:

$$V_{118}=V_{104}*(R_{117}/(R_{117}+R_{119}))$$ Equation 1 where $V_{118}$ is the desired attenuated voltage at output terminal 118, $V_{104}$ is the expected voltage at input terminal 104, $R_{117}$ is the resistance value of resistor 117, and $R_{119}$ is the resistance value of resistor 119. Thus, for example, if the expected voltage at input terminal 104 is 1000 volts and a desired voltage at output terminal 118 is 5 volts (which may be, e.g., an acceptable input voltage for controller 114), resistor 117 may be 50 ohms and resistor 119 may be 9,950 ohms. Other combinations of suitable resistance values for resistor 117 and resistor 119 that result in the desired attenuated voltage may alternatively be used. The actual resistors used may depend on the availability of resistors having certain resistance values. Furthermore, the actual attenuated voltage provided by voltage attenuator 116 may not be exactly as calculated because the resistance values may have +/− tolerances.

Second voltage attenuator 120 may include resistors 121 and 123 and an output terminal 122 that may be coupled to another input of controller 114. Second voltage attenuator 120 has an input terminal that may be coupled to output terminal 108 of power supply 100. Second voltage attenuator 120 may attenuate (i.e., reduce) a voltage received at output terminal 108 to the same desired lower voltage as voltage attenuator 116. Alternatively, the second voltage attenuator 120 may attenuate a voltage received at output terminal 108 to another desired lower voltage at output terminal 122, which may also be suitable for input to controller 114. To provide a desired attenuated voltage at output terminal 122 based on an expected voltage received at output terminal 108, the resistance values of resistors 121 and 123 may be determined in accordance with the following equation:

$$V_{122}=V_{108}*(R_{121}/(R_{121}+R_{123}))$$ Equation 2 where $V_{122}$ is the desired attenuated voltage at output terminal 122, $V_{108}$ is the expected voltage at output terminal 108, $R_{121}$ is the resistance value of resistor 121, and $R_{123}$ is the resistance value of resistor 123. Thus, for example, if the expected voltage at output terminal 108 is 2,300 volts and a desired voltage at output terminal 122 is 5 volts (which again may be, e.g., an acceptable input voltage for controller 114), resistor 121 may be 25 ohms and resistor 123 may be 11,475 ohms. Other combinations of suitable resistance values for resistor 121 and resistor 123 that result in the desired attenuated voltage may alternatively be used. And again, the actual resistors used may depend on the availability of resistors having certain resistance values. Furthermore, the actual attenuated voltage provided by voltage attenuator 120 may not be exactly as calculated because the resistance values may have +/− tolerances.

First and second voltage attenuators 116 and 120 are each designed to attenuate respective input and output voltages of power supply 100 to a desired attenuated voltage. Unless the expected input voltage at input terminal 104 and the expected output voltage at output terminal 108 are the same, and the desired attenuated voltages are the same, voltage attenuators 116 and 120 are not likely to be interchangeable, because each is likely to provide a different attenuated voltage at their respective output attenuator terminals 118 and 122 than is desired. Moreover, voltage attenuators 116 and 120 may not be usable in other power supplies having different attenuator input voltages and/or different desired attenuator output voltages. Power supplies requiring voltage attenuation of different input voltages and/or requiring different attenuated output voltages will likely need different voltage attenuators having one or more resistors with resistance values different than those of resistors 117, 119, 121, and/or 123.

Figure 2:
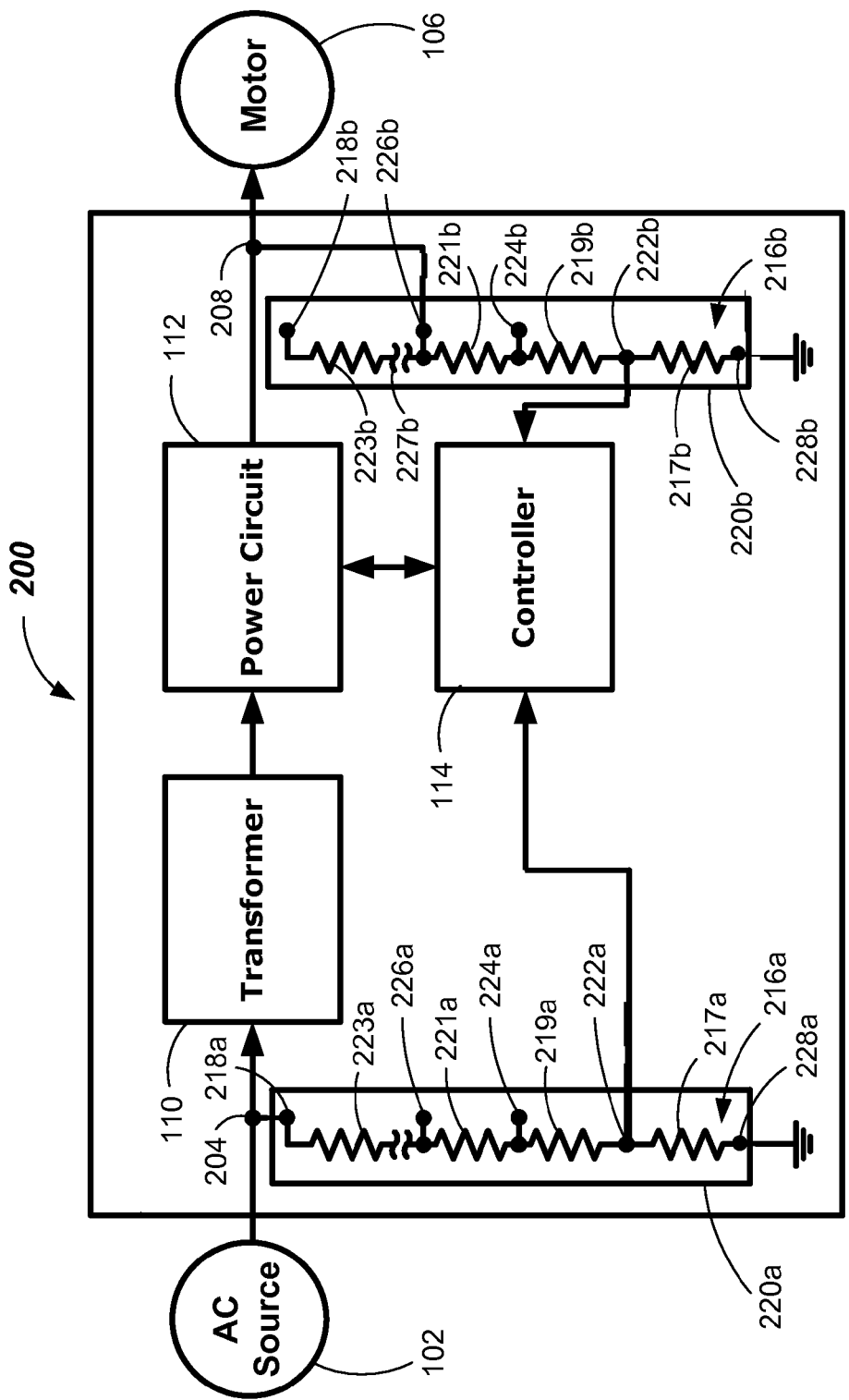
FIG. 2 illustrates a schematic diagram of a power supply having multi-tap voltage attenuators according to embodiments.

FIG. 2 illustrates an example of a power supply 200 in accordance with one or more embodiments. Similar to power supply 100, power supply 200 may be coupled to the three-phase AC input power source 102 at input terminal 204 and to the three-phase AC motor 106 at output terminal 208. In some embodiments, power supply 200 may be a medium-voltage power supply wherein input power source 102 may provide, e.g., from about 277 volts to about 8,000 volts AC. Power supply 200 may alternatively be another type of power supply and may alternatively be coupled to other suitable sources of input power at input terminal 204 and to other suitable loads at output terminal 208.

Power supply 200 may include transformer 110, power circuit 112, and controller 114, as described above in connection with power supply 100. As shown in FIG. 2, transformer 110 has an input coupled to input voltage terminal 204, power circuit 112 has an input coupled to an output of transformer 110 and an output coupled to output terminal 208, and controller 114 is coupled to power circuit 112. Alternatively, other suitable transformers, power circuits, and/or controllers may be used in power supply 200.

Power supply 200 may also include a first printed circuit board 220a having a first voltage attenuator 216a mounted thereon. First voltage attenuator 216a may be surface mounted or through-hole mounted on first printed circuit board 220a. First voltage attenuator 216a may include an input attenuator terminal 218a, a ground terminal 228a, and a plurality of output attenuator terminals 222a, 224a, and 226a, which may alternatively be referred to as output taps. Each output attenuator terminal 222a, 224a, and 226a may be configured to provide a different attenuated output voltage, as described in more detail below. Voltage attenuator 216a may also include a plurality of serially-coupled resistors 217a, 219a, 221 a, and 223a. Each output attenuator terminal 222a, 224a, and 226a may be coupled to a respective node between a pair of serially-coupled resistors. For example, output attenuator terminal 222a may be coupled to a node between resistors 217a and 219a, and output attenuator terminal 224a may be coupled to a node between resistors 219a and 221a.

In some embodiments, first voltage attenuator 216a may have, e.g., up to about 66 serially-coupled resistors and up to about 65 output attenuator terminals. Other numbers of serially-coupled resistors and/or output attenuator terminals may alternatively be provided in first voltage attenuator 216a. The resistance values of the serially-coupled resistors in first voltage attenuator 216a may be determined based on desired amounts of voltage attenuation to be provided at each of the output attenuator terminals and, thus, the resistance values may be all the same, all different, or some the same and some different. In some embodiments, all the serially-coupled resistors may have a resistance value of, e.g., 150 k ohms.

The attenuated output voltage provided at each output attenuator terminal 222a, 224a, and 226a may be determined in accordance with the following equation:

$$V_{OUT} = V_{IN} * (R_{FROM\ VOUT\ TO\ GND} / R_{TOTAL})$$ Equation 3 where $V_{OUT}$ is the attenuated output voltage provided at one of the output attenuator terminals 222a, 224a, or 226a; $V_{IN}$ is the attenuator input voltage received at input attenuator terminal 218a or, alternatively, at one of the output attenuator terminals 222a, 224a, or 226a serving as an input attenuator terminal (as described in more detail below); $R_{FROM\ VOUT\ TO\ GND}$ is the sum of the resistance values of the resistors between the output attenuator terminal represented by $V_{OUT}$ and ground terminal 228a; and $R_{TOTAL}$ is the sum of the resistance values of all resistors between the terminal at which the attenuator input voltage is received (which in this case is input attenuator terminal 218a) and ground terminal 228a. Accordingly, first voltage attenuator 216a may be designed to provide a large number of attenuated output voltages that may differ incrementally by the same or varying voltage amounts, depending on the resistance values of each of the serially-coupled resistors, the number of serially-coupled resistors, and/or the number of output attenuator terminals.

As shown in FIG. 2, input attenuator terminal 218a may be coupled to input terminal 204. In some embodiments, input attenuator terminal 218a may not be used to couple to an attenuator input voltage. Instead, one of the output attenuator terminals may be used. This may be done so one or more of the serially-coupled resistors between the input attenuator terminal and the output attenuator terminal serving as an input attenuator terminal may be excluded from the calculation of attenuated output voltages, allowing first voltage attenuator 216a to provide an alternative set of desired attenuated output voltages at the remaining output attenuator terminals. In some embodiments, the input attenuator terminal may alternatively be used as an output attenuator terminal.

As also shown in FIG. 2, output attenuator terminal 222a may be coupled to controller 114. Output attenuator terminal 222a may be coupled to an input of controller 114 because the attenuated output voltage provided at output attenuator terminal 222a may be within an acceptable range of input voltages of controller 114. For example, controller 114 may be operative with an input voltage range of from about −5 volts to about +5 volts AC and, based on an expected input voltage at input attenuator terminal 218a, the attenuated voltage at output attenuator terminal 222a may be determined to be within that range and, thus, output attenuator terminal 222a may be selected to be coupled to controller 114.

Power supply 200 may further have a second printed circuit board 220b having a second voltage attenuator 216b mounted thereon. Second voltage attenuator 216b may be substantially identical, if not completely identical, to voltage attenuator 216a. That is, second voltage attenuator 216b may be considered substantially identical to the first voltage attenuator 216a when for the same input attenuator voltage received by each of second voltage attenuator 216b and first voltage attenuator 216a, most of the attenuated output voltages provided by second voltage attenuator 216b and first voltage attenuator 216a are respectively within about +/−10% of each other (the +/−10% may account for component values tolerances such as the resistance values of the serially-coupled resistors).

Similarly, second printed circuit board 220b may be substantially identical, if not completely identical, to first printed circuit board 220a. That is, second circuit board 220b may be considered substantially identical to first circuit board 220a regardless of any physical differences between the two, such as, e.g., numbers and locations of connectors and contact pads, numbers and locations of surface and embedded conductors, and dimensions of the circuit board, provided that none of the differences affects the attenuated output voltages provided by their respective voltage attenuators by more than about +/−10%.

Second voltage attenuator 216b may be surface mounted or through-hole mounted on second printed circuit board 220b. Second voltage attenuator 216b may include an input attenuator terminal 218b, a ground terminal 228b, and a plurality of output attenuator terminals 222b, 224b, and 226b, which may alternatively be referred to as output taps. Each output attenuator terminal 222b, 224b, and 226b may be configured to provide a different attenuated output voltage, as described above in connection with the first voltage attenuator 216a. Second voltage attenuator 216b may also include a plurality of serially-coupled resistors 217b, 219b, 221b, and 223b. Each output attenuator terminal 222b, 224b, and 226b may be coupled to a respective node between a pair of serially-coupled resistors. For example, output attenuator terminal 222b may be coupled to a node between resistors 217b and 219b, and output attenuator terminal 224b may be coupled to a node between resistors 219b and 221b.

In some embodiments, second voltage attenuator 216b may have, e.g., up to about 66 serially-coupled resistors and up to about 65 output attenuator terminals. Other numbers of serially-coupled resistors and/or output attenuator terminals may alternatively be provided in second voltage attenuator 216b. The resistance values of the serially-coupled resistors in second voltage attenuator 216b may be determined based on desired amounts of voltage attenuation to be provided at each of the output attenuator terminals and, thus, the resistance values may be all the same, all different, or some the same and some different. In some embodiments, all the serially-coupled resistors may have a resistance value of, e.g., 150 k ohms.

The attenuated output voltage provided at each output attenuator terminal 222b, 224b, and 226b may be determined in accordance with Equation 3 above. As with first voltage attenuator 216a, second voltage attenuator 216b may also be designed to provide a large number of attenuated output voltages that may differ incrementally by the same or varying voltage amounts, depending on the resistance values of each of the serially-coupled resistors, the number of serially-coupled resistors, and/or the number of output attenuator terminals.

Unlike input attenuator terminal 218a of first voltage attenuator 216a, input attenuator terminal 218b of second voltage attenuator 216b may not be used to receive an input attenuator voltage. Instead, output attenuator terminal 226b, serving as an input attenuator terminal, may be coupled to receive an input attenuator voltage from output terminal 208. This may be done in cases where, e.g., the voltage at output terminal 208 may be different than the voltage at input terminal 204. That is, by selecting output attenuator terminal 226b as an input attenuator terminal, resistor 223b and any other resistors represented by continuity break 227b shown in FIG. 2 may be bypassed. This may allow second voltage attenuator 216b to provide an alternative set of attenuated voltages at the remaining output attenuator terminals, because the bypassed resistors may be excluded from the calculation of output attenuation voltages (unless input attenuator terminal 218b is coupled as an output attenuator terminal). Thus, second voltage attenuator 216b may be able to provide a desired attenuated output voltage at, e.g., output attenuator terminal 222b. Accordingly, output attenuator terminal 222b may be selected to couple to controller 114 because the attenuated output voltage provided at output attenuator terminal 222b may be within an acceptable range of input voltages of controller 114 that otherwise may not have been available had input attenuator terminal 218b been coupled to output terminal 208.

Thus, identical or substantially identical first and second voltage attenuators 216a and 216b and first and second printed circuit boards 220a and 220b may be used in power supply 200 to provide acceptable attenuated output voltages even though different input attenuator voltages may be received from input terminal 204 and output terminal 208. Note that, in some embodiments, first and second voltage attenuators 216a and 216b, and/or first and second printed circuit boards 220a and 220b, may include other circuit devices in addition to those shown in FIG. 2.

Figure 3:
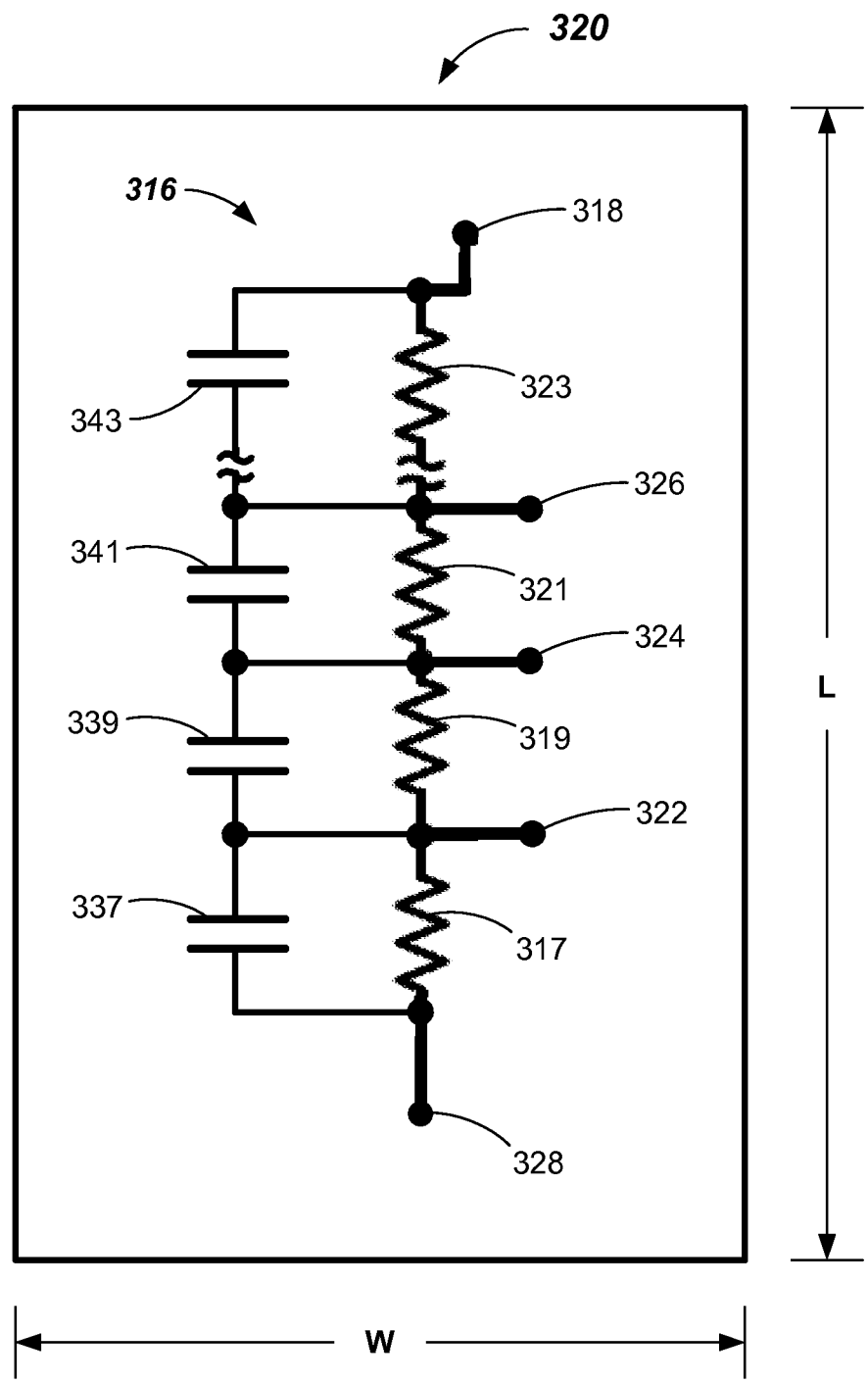
FIG. 3 illustrates a schematic diagram of a printed circuit board having a multi-tap voltage attenuator mounted thereon according to embodiments.

FIG. 3 illustrates a printed circuit board 320 having a voltage attenuator 316 mounted thereon in accordance with one or more embodiments. Voltage attenuator 316 may be surface mounted or through-hole mounted on printed circuit board 320. Voltage attenuator 316 may include an input attenuator terminal 318, a ground terminal 328, and a plurality of output attenuator terminals 322, 324, and 326, which may alternatively be referred to as output taps. Each output attenuator terminal 322, 324, and 326 may provide a different attenuated output voltage, as described above in connection with voltage attenuators 216a and 216b. Voltage attenuator 316 may also include a plurality of serially-coupled resistors 317, 319, 321, and 323. In some embodiments, voltage attenuator 316 may include other numbers of serially-coupled resistors and output attenuator terminals. During voltage transients on serially-coupled resistors 317, 319, 321, and 323, which may be caused by an AC attenuator input voltage, stray capacitance may adversely affect one or more characteristics and/or parameters related to the attenuated output voltages provided at output attenuator terminals 322, 324, and 326. To at least partly compensate for such stray capacitance, a shunt capacitor may, in some embodiments, be coupled in parallel with (i.e., across) each of the serially-coupled resistors, as shown by capacitors 337, 339, 341, and 343, which are coupled in parallel with respective resistors 317, 319, 321, and 323. In some embodiments, each of capacitors 337, 339, 341, and 343 may be 1000 picofarads. Alternatively, capacitors 337, 339, 341, and 343 may have other suitable capacitance values. In some embodiments, shunt capacitors may also be included in voltage attenuators 216a and/or 216b.

In some embodiments, first and second printed circuit boards 220a, 220b, and/or 320 may have a length L of about 8 inches (20.3 cm) and a width W of about 5 inches (12.7 cm), plus or minus 0.5 inches (1.27 cm), as illustrated in FIG. 3. In other embodiments, printed circuit boards 220a, 220b, and/or 320 may alternatively have other length and/or width dimensions, and may have shapes other than rectangular.

Returning to FIG. 2, additional circuitry (not shown) may, in some embodiments, be included in power supply 200. For example, additional circuitry may be coupled between first voltage attenuator 216a and controller 114 and/or between second voltage attenuator 216b and controller 114 to provide interfacing that may be desirable in some embodiments of controller 114. This additional interfacing circuitry may, in some embodiments, be optionally provided on first printed circuit board 220a and/or second printed circuit board 220b during assembly of power supply 200. Furthermore, in some embodiments, additional circuitry may include overload protection circuitry and/or filter circuitry (neither shown) that may be coupled between controller 114 and first and/or second voltage attenuators 216a and/or 216b.

While first and second voltage attenuators 216a and 216b are shown in FIG. 2 as providing attenuated output voltages to controller 114, in some alternative embodiments, first and second voltage attenuators 216a and/or 216b may provide one or more attenuated output voltages to one or more other circuit devices of power supply 200 in addition to, or alternatively to, providing attenuated output voltages to controller 114. Furthermore, power supply 200 may include one or more other voltage attenuators substantially identical to first and/or second voltage attenuators 216a and/or 216b. In some embodiments, an attenuated output voltage of one voltage attenuator 216a or 216b may be coupled as an input to another voltage attenuator 216a or 216b for additional voltage attenuation.

Figure 4:
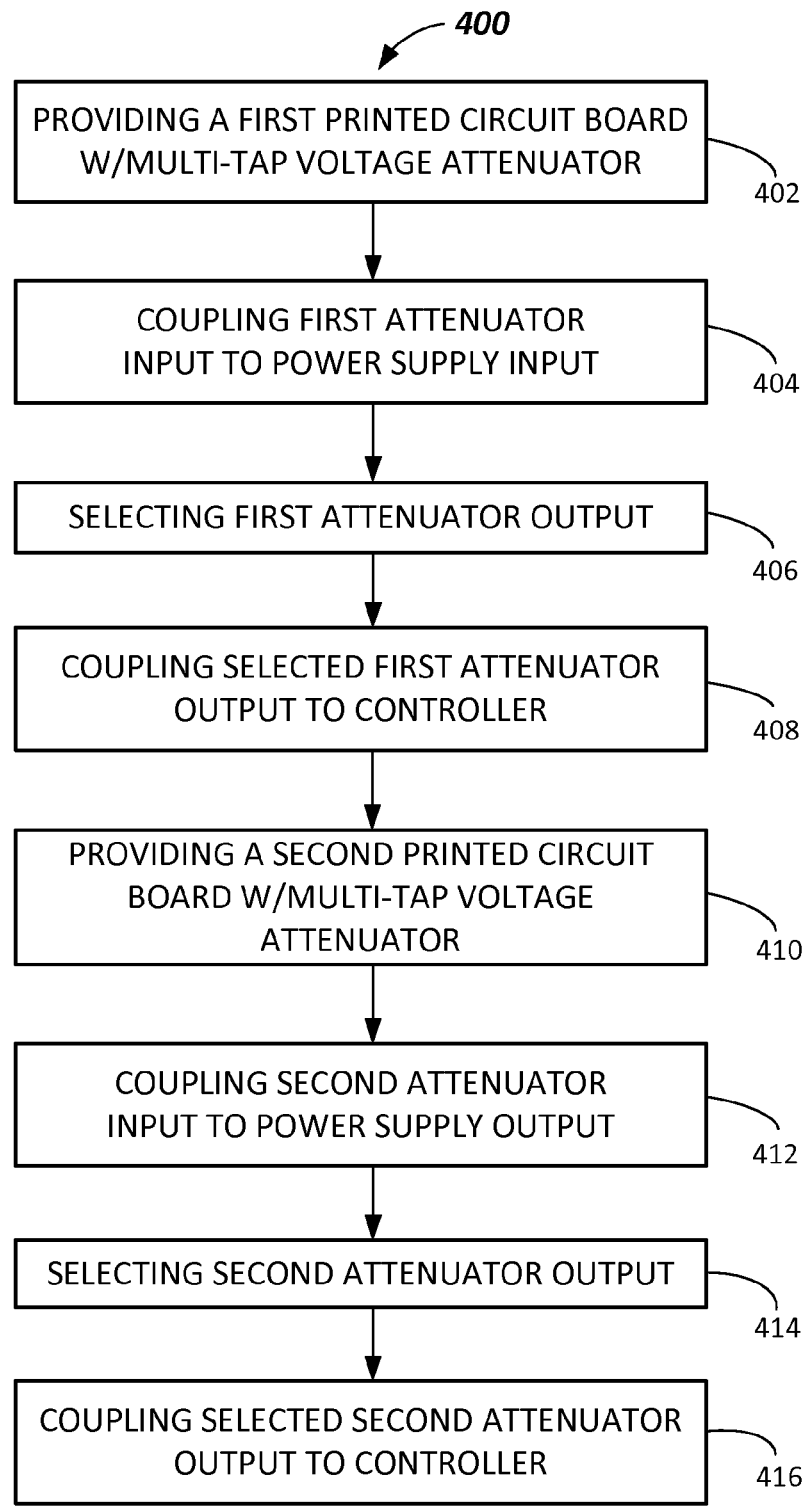
FIG. 4 illustrates a flowchart of a method of assembling a power supply according to embodiments.

FIG. 4 illustrates a flowchart of a method 400 of assembling a power supply in accordance with one or more embodiments. The power supply may be, e.g., power supply 200. Method 400 may include at process block 402 providing a first printed circuit board having a multi-tap voltage attenuator. The multi-tap voltage attenuator may have an input attenuator terminal and a plurality of output attenuator terminals, wherein each of the plurality of output attenuator terminals may be operative to output a different attenuated voltage. The multi-tap voltage attenuator may also have a plurality of serially-coupled resistors, wherein each output attenuator terminal may be coupled to a respective node between a pair of serially-coupled resistors. The first printed circuit board may be, e.g., any one of printed circuit boards 220a, 220b, or 320. The multi-tap voltage attenuator may be, e.g., any one of voltage attenuators 216a, 216b, or 316.

At process block 404, the input attenuator terminal of the voltage attenuator may be coupled to an input terminal of the power supply. For example, input attenuator terminal 218a of first voltage attenuator 216a may be coupled to input terminal 204 of power supply 200. Coupling of the input attenuator terminal to an input terminal of the power supply may be made in any suitable manner, and may be made manually, by automatic equipment, or by combinations of both. Alternatively, one of the output attenuator terminals may be used as the input attenuator terminal. The voltage at the input terminal of the power supply may be considered the attenuator input voltage of the first printed circuit board.

Figure 5:
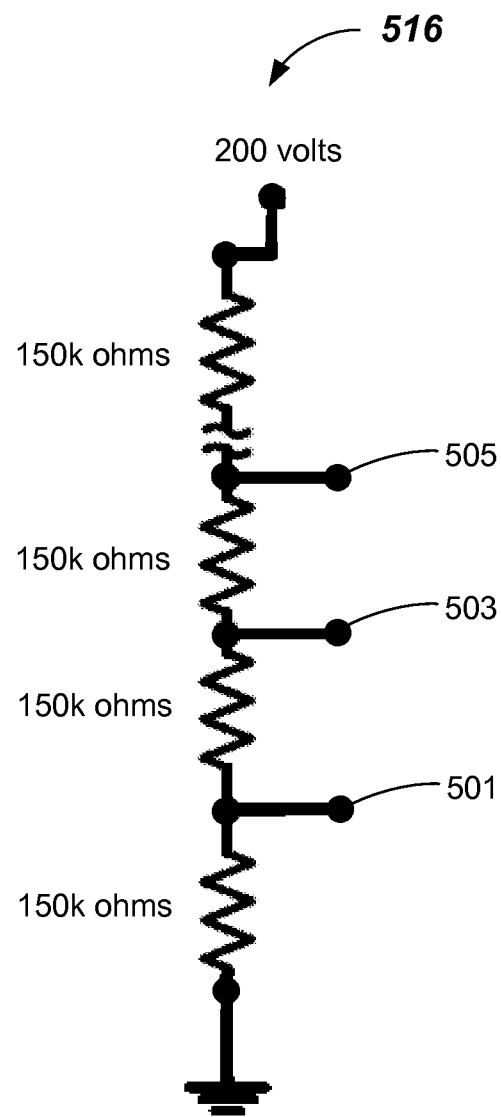
FIG. 5 illustrates a schematic diagram of a multi-tap voltage attenuator according to embodiments.

At process block 406, method 400 may include selecting one of the plurality of output attenuator terminals based on an expected attenuator input voltage, a desired attenuator output voltage, and the resistance values of the serially-coupled resistors of the voltage attenuator. The desired attenuator output voltage may be a voltage within an acceptable range of voltages suitable for input to a controller or other circuit device of the power supply. For example, the desired attenuator output voltage may be within an acceptable range of input voltages for controller 114 of FIG. 2. In some embodiments, Equation 3 may be used to determine which of the plurality of output attenuator terminals provides the desired attenuator output voltage. For example, as represented in FIG. 5, a voltage attenuator 516 may have 40 serially-coupled resistors of 150 k ohms each and up to 39 output attenuator terminals. The attenuator input voltage may be 200 volts, and a desired attenuator output voltage may be 12 volts maximum. Equations 4, 5, and 6 below (all based on Equation 3) may be used to determine that output attenuator terminal 501 provides an attenuated output voltage of 5 volts, output attenuator terminal 503 provides an attenuated output voltage of 10 volts, and output attenuator terminal 505 provides an attenuated output voltage of 15 volts.

$$V_{501}=200*(150\ k/6000\ k)=5\ \text{volts} \qquad \text{Equation 4}$$

$$V_{503}=200*(300\ k/6000\ k)=10\ \text{volts} \qquad \text{Equation 4}$$

$$V_{505}=200*(450\ k/6000\ k)=15\ \text{volts} \qquad \text{Equation 6}$$

Thus, either of output attenuator terminals 501 or 503 may be selected, depending on selection criteria. For example, if the selection criteria indicated that a voltage closest to but not exceeding the maximum desired voltage be selected, then output attenuator terminal 503 would be selected.

At process block 408, the selected output attenuator terminal of the voltage attenuator may be coupled to a controller or other circuit device of the power supply. As shown in FIG. 2, for example, the selected output attenuator terminal may be output attenuator terminal 222a of first voltage attenuator 216a, and output attenuator terminal 222a may be coupled to controller 114. Coupling of the selected output attenuator terminal to a controller or other circuit device of the power supply may be made in any suitable manner, and may be made manually, by automatic equipment, or by combinations of both.

Method 400 may include at process block 410 providing a second printed circuit board having a multi-tap voltage attenuator. The multi-tap voltage attenuator may have an input attenuator terminal and a plurality of output attenuator terminals, wherein each of the plurality of output attenuator terminals may be operative to output a different attenuated voltage. In some embodiments, one of the output attenuator terminals may serve as an input attenuator terminal. The multi-tap voltage attenuator may also have a plurality of serially-coupled resistors, wherein each output attenuator terminal may be coupled to a respective node between a pair of serially-coupled resistors. The second printed circuit board may be, e.g., any one of printed circuit boards 220a, 220b, or 320. The multi-tap voltage attenuator may be, e.g., any one of voltage attenuators 216a, 216b, or 316. Furthermore, the second printed circuit board may be identical or substantially identical to the first printed circuit board provided at process block 402. Still further, the voltage attenuator of the second printed circuit board may be identical or substantially identical to the voltage attenuator of the first printed circuit board.

At process block 412, the input attenuator terminal or one of the output attenuator terminals serving as an input attenuator terminal of the voltage attenuator may be coupled to an output terminal of the power supply. For example, as shown in FIG. 2, output attenuator terminal 226b of second voltage attenuator 216b may be coupled as an input attenuator terminal to output terminal 208 of power supply 200. Coupling of an input attenuator terminal to an output terminal of the power supply may be made in any suitable manner, and may be made manually, by automatic equipment, or by combinations of both. The output supply voltage of the power supply may be considered the attenuator input voltage of the second printed circuit board.

At process block 414, method 400 may include selecting one of the plurality of output attenuator terminals on the second printed circuit board based on an expected attenuator input voltage, a desired attenuator output voltage, and the resistance values of the serially-coupled resistors between the output attenuator terminal serving as the input attenuator terminal and the ground terminal. The desired attenuator output voltage may be a voltage within an acceptable range of voltages suitable for input to a controller, such as, e.g., controller 114, or other circuit device of the power supply. The desired attenuator output voltage may also be the same desired attenuator voltage described in connection with process block 406. The selection of one of the plurality of output attenuator terminals may be made using Equation 3 as also described above in connection with process block 406.

At process block 416, the selected output attenuator terminal of the voltage attenuator of the second printed circuit board may be coupled to a controller or other circuit device of the power supply. For example, as shown in FIG. 2, the selected output attenuator terminal may be output attenuator terminal 222b of second voltage attenuator 216b, and output attenuator terminal 222b may be coupled to controller 114. Coupling of the selected output attenuator terminal to a controller or other circuit device of the power supply may be made in any suitable manner, and may be made manually, by automatic equipment, or by combinations of both.

Figure 6:
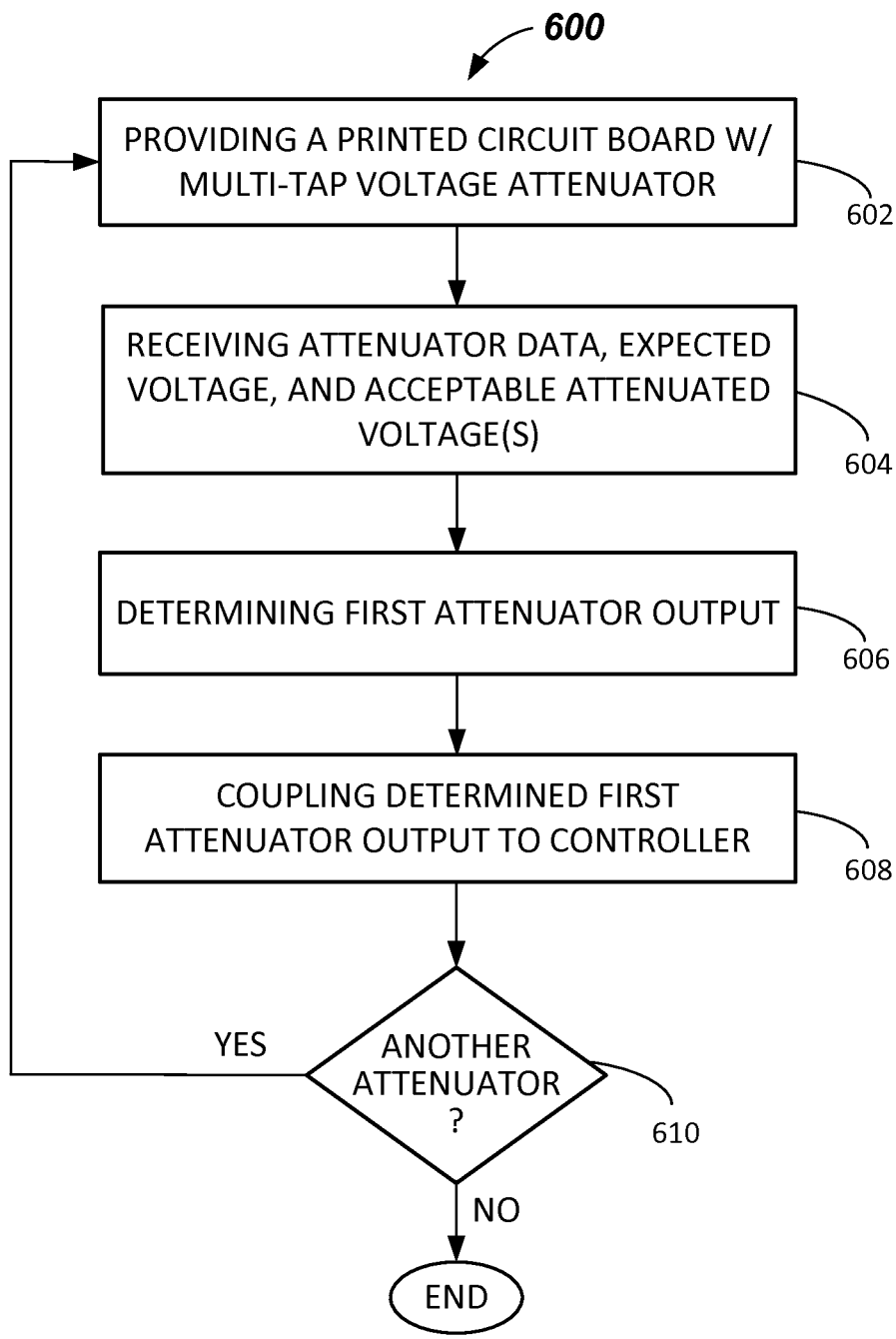
FIG. 6 illustrates a flowchart of another method of assembling a power supply according to embodiments.

FIG. 6 illustrates a flowchart of another method of assembling a power supply in accordance with one or more embodiments. The power supply may be, e.g., power supply 200. Method 600 may include at process block 602 providing a printed circuit board having a voltage attenuator. The voltage attenuator may have an input attenuator terminal and a plurality of output attenuator terminals, wherein each of the plurality of output attenuator terminals may be operative to output a different attenuated voltage. The voltage attenuator may also have a plurality of serially-coupled resistors, wherein each output attenuator terminal may be coupled to a respective node between a pair of serially-coupled resistors. The printed circuit board may be, e.g., any one of printed circuit boards 220a, 220b, or 320. The multi-tap voltage attenuator may be, e.g., any one of voltage attenuators 216a, 216b, 316, or 516.

At process block 604, method 600 may include receiving at a hardware processor (1) attenuator data related to an amount of voltage attenuation that may be provided at each of the plurality of output attenuator terminals, (2) an expected voltage value of a voltage that may be received at the input attenuator terminal or an output attenuator terminal serving as an input attenuator terminal, and (3) one or more attenuated voltage values that may be acceptable for input to a controller or other circuit device of the power supply. This may include, e.g., receiving the number and resistance values of the plurality of serially-coupled resistors included in the voltage attenuator, and the number of output attenuator terminals. This may also include, e.g., receiving an expected attenuator input voltage value, such as, e.g., an input voltage received by the power supply or an output voltage provided by the power supply. This may further include, e.g., receiving a maximum voltage value or range of voltage values acceptable for input to a controller, such as, e.g., controller 114, or other circuit device of the power supply. For example, a range of acceptable voltage values for a controller may be −5 volts to +5 volts. The hardware processor may also receive selection criteria for those cases in which more than one output attenuator terminal may provide an acceptable attenuated output voltage. The hardware processor may be operative to execute programming instructions or the like of a computer-aided design (CAD) program or tool or other computer program or tool suitable for performing various calculations and functions related to the assembly of a power supply in accordance with one or more embodiments.

At process block 606, the hardware processor may determine which of the plurality of output attenuator terminals provides the one or more acceptable attenuated voltage values based on the received attenuator data, the received expected voltage value, the received one or more acceptable attenuated voltage values, and/or the received selection criteria. The hardware processor may make the determination using Equation 3 to calculate attenuated voltages that may be provided at the output attenuator terminals, as described above in connection with process block 406. The hardware processor may then, if necessary, apply any received selection criteria to two or more acceptable output attenuator terminals. Alternatively, the hardware processor may make the determination in any other suitable manner.

At process block 608, method 600 may include coupling to an input of the controller or other circuit device of the power supply the output attenuator terminal determined at process block 606 to provide the one or more attenuated voltage values acceptable for input to the controller or other circuit device. For example, as shown in FIG. 2, the determined output attenuator terminal may be output attenuator terminal 222a of first voltage attenuator 216a, and output attenuator terminal 222a may be coupled to controller 114, or the determined output attenuator terminal may be output attenuator terminal 222b of second voltage attenuator 216b, and output attenuator terminal 222b may be coupled to controller 114. The coupling may be performed manually, by automated equipment, or by combinations of both, and may be made in any suitable manner.

At decision block 610, method 600 may determine whether another voltage attenuator needs to be assembled in the power supply. If another voltage attenuator is needed, method 600 may return to process block 602, where a second printed circuit board having a second voltage attenuator mounted thereon may be provided. In some embodiments, the second voltage attenuator and/or the second printed circuit board may be substantially identical, if not identical, to the first voltage attenuator and/or the first printed circuit board. If an additional voltage attenuator is not needed in the power supply, method 600 may end.

Various process blocks of methods 400 and/or 600 may be executed or performed in an order or sequence not limited to the order and sequence shown and described. For example, in some embodiments, process blocks 402-408 of method 400 may be performed after process blocks 410-416. Also, some of the process blocks of methods 400 and/or 600 may be executed or performed substantially simultaneously or in parallel where appropriate or desired. For example, in some embodiments, process block 410 of method 400 may be performed substantially simultaneously or in parallel with any one of process blocks 404-408.

Figure 7:
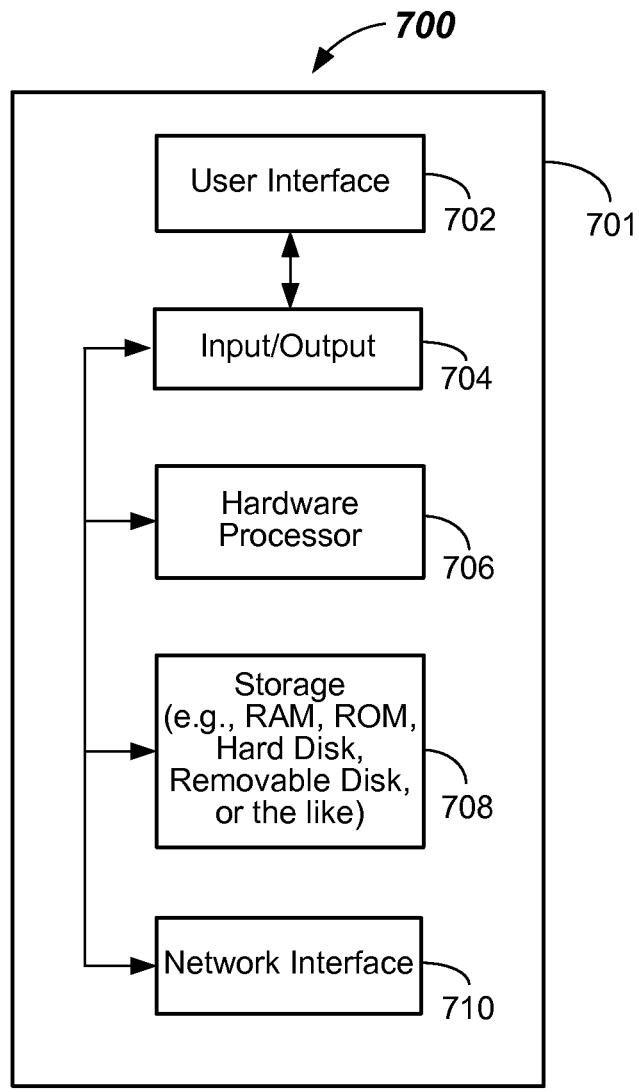
FIG. 7 illustrates a system configured to implement the method of FIG. 6 according to embodiments.

FIG. 7 shows a computer system 700 that may be used to implement method 600 in accordance with some embodiments. System 700 may include one or more computers 701, which may be a general purpose device or a special purpose device, such as a server in a client/server based environment. For example, computer 701 may be a personal computer, workstation, or laptop computer and/or may be a standalone device or part of a network. Computer 701 may include any suitable components such as one or more of the following: a user interface 702, an input/output device 704, a hardware processor 706 (which may be a microprocessor, digital signal processor, controller, etc.), a storage device 708 (which may be a RAM, ROM, hard disk, removable disk, etc.), and a network interface 710. User interface 702 may include, e.g., a graphical user interface, and input/output device 704 may include, e.g., a graphics display unit, wherein computer 701 may further include one or more display controllers (not shown). Computer 701 may be, e.g., suitable for running a CAD program or tool that may perform, among other things, various calculations and functions related to the assembly of a power supply. Hardware processor 706 may execute programming instructions that may be stored in one or more storage devices 708 to perform, for example, one or more functions of method 700. Storage device 708 may be suitable for storing data and/or for maintaining one or more database systems. Network interface 710 may establish communication with the Internet and/or any other suitable communications networks. Computer 701 may further include other suitable communications interfaces for communicating directly with other devices, servers/computers, and/or peripherals.

Persons skilled in the art should readily appreciate that the invention described herein is susceptible of broad utility and application. Many embodiments and adaptations of the invention other than those described herein, as well as many variations, modifications, and equivalent arrangements, will be apparent from, or reasonably suggested by, the invention and the foregoing description thereof, without departing from the substance or scope of the invention. For example, although described in connection with medium-voltage power supplies, one or more embodiments of the invention may be used with other types of power supplies and/or other electrical or electronic devices. Accordingly, while the invention has been described herein in detail in relation to specific embodiments, it should be understood that this disclosure is only illustrative and presents examples of the invention and is made merely for purposes of providing a full and enabling disclosure of the invention. This disclosure is not intended to limit the invention to the particular apparatus, devices, assemblies, systems or methods disclosed, but, to the contrary, the intention is to cover all modifications, equivalents, and alternatives falling within the scope of the invention.

What is claimed is:

1. A power supply, comprising:
   a first printed circuit board comprising a first voltage attenuator mounted thereon, the first voltage attenuator having a first input attenuator terminal and a plurality of first output attenuator terminals, wherein each first output attenuator terminal is configured to provide a different attenuated voltage based on a first attenuator input voltage received at the first input attenuator terminal; and
   a second printed circuit board comprising a second voltage attenuator mounted thereon, the second voltage attenuator having a second input attenuator terminal and a plurality of second output attenuator terminals, wherein each second output attenuator terminal is configured to provide a different attenuated voltage based on a second attenuator input voltage received at the second output attenuator terminal,
   wherein the first voltage attenuator is substantially identical to the second voltage attenuator.

2. The power supply of claim 1, further comprising:
   an input voltage terminal and an output voltage terminal;
   a transformer having an input coupled to the input voltage terminal;

a power circuit having an input coupled to an output of the transformer and having an output coupled to the output terminal; and a controller having an output coupled to the power circuit, wherein:

the first input attenuator terminal or one of the plurality of first output attenuator terminals serving as a first input attenuator terminal is coupled to the input voltage terminal;

one of the plurality of first output attenuator terminals not coupled as the first input attenuator terminal is coupled to a first input of the controller;

the second input attenuator terminal or one of the plurality of second output attenuator terminals serving as a second input attenuator terminal is coupled to the output voltage terminal; and one of the plurality of second output attenuator terminals not coupled as the second input attenuator terminal is coupled to a second input of the controller.

3. The power supply of claim 2 wherein:

the one of the plurality of first output attenuator terminals coupled to the first input of the controller provides an attenuated voltage within an acceptable range of controller input voltages; and the one of the plurality of second output attenuator terminals coupled to the second input of the controller provides an attenuated voltage within the acceptable range of controller input voltages.

4. The power supply of claim 2 wherein an attenuated voltage at the one of the plurality of first output attenuator terminals coupled to the first input of the controller is of the same order of magnitude as an attenuated voltage at the one of the plurality of second output attenuator terminals coupled to the second input of the controller.

5. The power supply of claim 1 wherein the first and second printed circuit boards each have a length of about 8 inches (20.3 cm) and a width of about 5 inches (12.7 cm).

6. The power supply of claim 1 wherein the first or the second voltage attenuator comprises a plurality of resistors coupled in series, wherein each one of the first or the second output attenuator terminals is coupled between a respective pair of the plurality of resistors.

7. The power supply of claim 6 wherein each of the plurality of resistors has a same or a different resistance value as the other of the plurality of resistors.

8. The power supply of claim 6 wherein the first or the second voltage attenuator comprises a plurality of capacitors wherein each one of the plurality of capacitors is coupled in parallel with a respective one of the plurality of resistors.

9. A method of assembling a power supply, comprising:

providing a first printed circuit board having a first voltage attenuator thereon, the first voltage attenuator having an input attenuator terminal and a plurality of output attenuator terminals, each of the plurality of output attenuator terminals operative to output a different attenuated voltage;

coupling the input attenuator terminal or one of the plurality of output attenuator terminals serving as an input attenuator terminal of the first voltage attenuator to an input terminal of the power supply;

selecting one of the plurality of output attenuator terminals of the first voltage attenuator based on an expected voltage at the input terminal of the power supply;

coupling the selected one of the plurality of output attenuator terminals of the first voltage attenuator to a controller or other circuit device of the power supply;

providing a second printed circuit board having a second voltage attenuator thereon, the second voltage attenuator having an input attenuator terminal and a plurality of output attenuator terminals, each of the plurality of output attenuator terminals operative to output a different attenuated voltage;

coupling the input attenuator terminal or one of the plurality of output attenuator terminals serving as an input attenuator terminal of the second voltage attenuator to an output terminal of the power supply;

selecting one of the plurality of output attenuator terminals of the second voltage attenuator based on an expected voltage at the output terminal of the power supply; and coupling the selected one of the plurality of output attenuator terminals of the second voltage attenuator to the controller or other circuit device of the power supply; wherein:

the first voltage attenuator is substantially identical to the second voltage attenuator.

10. The method of claim 9, further comprising:

coupling an input of a transformer to the input terminal of the power supply;

coupling an input of a power circuit to an output of the transformer;

coupling an output of the power circuit to the output terminal of the power supply; and coupling an output of the controller to an input of the power circuit.

11. The method of claim 9 wherein the providing the first printed circuit board comprises providing the first printed board having the first voltage attenuator wherein the first voltage attenuator comprises a plurality of resistors coupled in series and each one of the output attenuator terminals of the first voltage attenuator is coupled between a respective pair of the plurality of resistors.

12. The method of claim 9 wherein the providing the first printed circuit board comprises providing the first printed circuit board having the first voltage attenuator wherein the first voltage attenuator comprises a plurality of resistors all having the same resistance value.

13. A method of assembling a power supply, comprising:

providing a first printed circuit board having a first voltage attenuator thereon, the first voltage attenuator having an input attenuator terminal and a plurality of output attenuator terminals, wherein each of the plurality of output attenuator terminals is operative to output a different attenuated voltage;

receiving at a hardware processor:

attenuator data related to an amount of voltage attenuation provided at each of the plurality of output attenuator terminals, an expected voltage value of a voltage to be received at the input attenuator terminal or one of the plurality of output attenuator terminals serving as an input attenuator terminal, and one or more attenuated voltage values acceptable for input to a controller or other circuit device of the power supply;

determining, by the hardware processor, which one of the plurality of output attenuator terminals provides the one or more attenuated voltage values based on the received attenuator data, the received expected voltage value, and the received one or more attenuated voltage values; and coupling to a first input of the controller or other circuit device one of the plurality of output attenuator terminals of the first voltage attenuator determined to provide the one or more attenuated voltage values.

14. The method of claim 13, further comprising:
coupling the input attenuator terminal or one of the plurality of output attenuator terminals serving as an input attenuator terminal of the first voltage attenuator to an input terminal of the power supply in response to the expected voltage value to be received being an expected input power supply voltage value to be received at the input terminal of the power supply; or
coupling the input attenuator terminal or one of the plurality of output attenuator terminals serving as an input attenuator terminal of the first voltage attenuator to an output terminal of the power supply in response to the expected voltage value to be received being an expected output power supply voltage value to be provided at the output terminal of the power supply.

15. The method of claim 13, further comprising:
providing a second printed circuit board having a second voltage attenuator thereon, the second voltage attenuator substantially identical to the first voltage attenuator, the second voltage attenuator having an input attenuator terminal and a plurality of output attenuator terminals, wherein each of the plurality of output attenuator terminals of the second printed circuit board is operative to output a different attenuated voltage;
receiving at the hardware processor an expected voltage value to be received at the input attenuator terminal or one of the plurality of output attenuator terminals serving as an input attenuator terminal of the second voltage attenuator;
determining, by the hardware processor, which one of the plurality of output attenuator terminals of the second voltage attenuator provides the one or more attenuated voltage values acceptable for input to the controller based on the received attenuator data, the received expected voltage value, and the received one or more attenuated voltage values; and
coupling to a second input of the controller one of the plurality of output attenuator terminals of the second voltage attenuator determined to provide the one or more attenuated voltage values; wherein:
the second voltage attenuator is substantially identical to the first voltage attenuator.

16. The method of claim 13, further comprising:
coupling an input of a transformer to an input terminal of the power supply;
coupling an input of a power circuit to an output of the transformer;
coupling an output of the power circuit to an output terminal of the power supply; and
coupling an output of the controller to an input of the power circuit.

17. The method of claim 13 wherein the providing the first printed circuit board comprising providing the first printed circuit board having a first voltage attenuator thereon that comprises a plurality of resistors coupled in series, wherein each one of the output attenuator terminals is coupled between a respective pair of the plurality of resistors.

\* \* \* \* \*